US006656770B2

(12) United States Patent
Atwood et al.

(10) Patent No.: US 6,656,770 B2
(45) Date of Patent: Dec. 2, 2003

(54) THERMAL ENHANCEMENT APPROACH USING SOLDER COMPOSITIONS IN THE LIQUID STATE

(75) Inventors: Eugene R. Atwood, Housatonic, MA (US); Joseph A. Benenati, Hopewell Junction, NY (US); Giulio DiGiacomo, Hopewell Junction, NY (US); Horatio Quinones, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 09/874,826

(22) Filed: Jun. 5, 2001

(65) Prior Publication Data

US 2001/0026957 A1 Oct. 4, 2001

Related U.S. Application Data

(62) Division of application No. 09/052,296, filed on Mar. 31, 1998, now Pat. No. 6,281,573.

(51) Int. Cl.[7] .......................... H01L 21/44; H01L 21/48; H01L 21/50; H01L 23/34
(52) U.S. Cl. ......................... 438/118; 438/108; 257/713
(58) Field of Search ............................... 438/108, 118; 257/713

(56) References Cited

U.S. PATENT DOCUMENTS

| 3,649,881 A | | 3/1972 | Chang et al. |
| 4,092,697 A | | 5/1978 | Spaight |
| 4,254,431 A | | 3/1981 | Babuka et al. |
| 4,479,140 A | | 10/1984 | Horvath |
| 4,607,277 A | * | 8/1986 | Hassan et al. ................. 357/81 |
| 5,049,972 A | | 9/1991 | Uda et al. |
| 5,170,930 A | | 12/1992 | Dolbear et al. |
| 5,276,289 A | | 1/1994 | Satoh et al. |
| 5,311,402 A | | 5/1994 | Kobayashi et al. |
| 5,325,265 A | | 6/1994 | Turlik et al. |
| 5,329,160 A | | 7/1994 | Miura et al. |
| 5,445,308 A | | 8/1995 | Nelson et al. |
| 5,468,655 A | | 11/1995 | Greer |
| 5,536,362 A | | 7/1996 | Love et al. |
| 5,611,481 A | * | 3/1997 | Akamatsu et al. ..... 228/180.22 |
| 5,623,394 A | | 4/1997 | Sherif et al. |
| 5,668,058 A | | 9/1997 | Tanioka et al. |
| 5,672,548 A | | 9/1997 | Culnane et al. |
| 5,684,677 A | | 11/1997 | Uchida et al. |
| 5,768,108 A | | 6/1998 | Miura et al. |
| 5,773,362 A | * | 6/1998 | Tonti et al. .................. 438/665 |
| 5,789,810 A | | 8/1998 | Gross et al. |
| 5,821,161 A | | 10/1998 | Covell, II et al. |
| 5,866,943 A | | 2/1999 | Mertol |
| 5,880,524 A | | 3/1999 | Xie |
| 5,886,408 A | | 3/1999 | Ohki et al. |
| 5,905,636 A | | 5/1999 | Baska et al. |
| 5,919,329 A | | 7/1999 | Banks et al. |
| 5,931,222 A | | 8/1999 | Toy et al. |
| 5,945,736 A | | 8/1999 | Rife et al. |

OTHER PUBLICATIONS

IBM Technical Disclosure Bulletin, "*Thermal Enhancement of Modules*", vol. 19, No. 8, Jan. 1977.
IBM Technical Disclosure Bulletin, "*Liquid–Filled Bellows Heat Sink*", vol. 21, No. 10, Mar. 1979.
IBM Technical Disclosure Bulletin, "*Semiconductor Chip with Liquid Metal Heat Transfer*", vol. 22, No. 4, Sep. 1979.
IBM Technical Disclosure Bulletin, "*Chip Cooling Employing A Conformable Alloy*", vol. 24, No. 11A, Apr. 1982.
IBM Technical Disclosure Bulletin, "*Thermal Sponge*", vol. 29, No. 11, Apr. 1987.

* cited by examiner

Primary Examiner—Wael Fahmy
Assistant Examiner—Nema Berezny
(74) Attorney, Agent, or Firm—James J. Cioffi

(57) ABSTRACT

Solder compositions are introduced to interface between an IC chip and its associated heat exchanger cover. The solder compositions have a solidus-liquidus temperature range that encompasses the IC chip operational temperature range. The solder composition has the desired property of absorbing and rejecting heat energy by changing state or phase with each temperature rise and decline that result from temperature fluctuations associated with the thermal cycles of the integrated circuit chips.

The electronic module cover is a cap with a heat exchanger formed or attached as a single construction, and made of the same material as the substrate, or made with materials of compatible thermal coefficients of expansion to mitigate the effects of vertical displacement during thermal cycling. The cap-heat exchanger cover is constructed to be compliant, and to contact both the IC chip and substrate in order to provide, in conjunction with the solder composition, a path of high thermal conduction (low thermal resistance) from the IC chip to the heat exchanger to the ambient air.

22 Claims, 5 Drawing Sheets

THERMAL ENHANCEMENT APPROACH USING SOLDER COMPOSITIONS IN THE LIQUID STATE

This is a divisional of application Ser. No. 09/052,296 filed on Mar. 31, 1998 now U.S. Pat. No. 6,281,573 issued Sep. 28, 2001.

BACKGROUND OF THE INVENTION

1. Field of the Invention

This invention relates to heat dissipation of a semiconductor device or electronic module, and in particular to a method and means for accomplishing such dissipation and reducing stresses caused by thermal gradients by employing an electronic module cap and heat exchanger as a single structure, and a semi-molten material between the IC chip and its associated heat exchanger to melt and solidify in the IC chip operational temperature range in order to release and absorb heat energy and create a low thermal resistance path to the heat exchanger.

2. Description of Related Art

Technological advancements in semiconductor device design and fabrication have significantly increased integrated circuit chip power requirements, and these requirements continue to climb. In order to accommodate these enhanced power requirements, it has become necessary to find more efficient ways to dissipate heat through the electronic packages and their associated heat exchangers.

Current electronic module designs do not efficiently dissipate heat energy at rates beyond power levels of 25 to 50 Watts. Beyond these levels expensive methods of water cooling are necessary to minimize the external thermal resistance and maximize the thermal gradient, thus enhancing heat flow. The power dissipation is inherently limited by both internal and external thermal resistance to heat flow. Thermal pastes currently in use as low thermal resistant conductors between an IC chip and its heat exchanger are adequate to satisfy the thermal dissipation requirements at the present state of the art, however, they are inadequate for the much higher power allotments being contemplated for future designs. Although there are many materials, especially metals, that have excellent thermal conductivity satisfying the thermal dissipation requirements, most of the metals in the solid state induce intolerable stresses in the multi-chip modules during thermal cycling. The conductive material used for this heat transfer is typically placed between the IC chip and the heat exchanger, and consequently may be exposed to considerably different thermal expansion coefficients (TECs) and/or different temperatures due to thermal gradients. The result is IC chip cracking, unacceptable C-4 solder deformation, and excessive fatigue damage leading to early failure.

There is also the associated problem of operational thermal cycling or mini-cycles that are common among devices employing power saving schemes, such as CMOS technology parts. The alternating power demands by the IC chip exacerbate the power dissipation requirements and enhance device fatigue. Thus, in order to accommodate a new generation of devices and establish a more efficient thermal transfer from the IC chip to its heat exchanger, the effects of mini-cycles must also be attenuated.

To prevent an IC chip from exceeding its prescribed operating temperature, it is necessary to maximize the heat flow across the interface to the chip's heat exchanger such that heat may be effectively conducted away from the chip. A key concern with high heat generating chips is the achievement of very low and stable chip thermal contact resistance. This requires the use of a thermal dissipation technique that embodies thermal and mechanical properties such that uniform contact loading and low interface thermal resistance are continuously maintained. The prior art has considered a number of techniques towards this objective. Most can be classified as one of either a solid metallurgical bond, a microstructural or structural contact, a demountable liquid or grease interface, or a combination of these types.

In U.S. Pat. No. 5,170,930 issued to Dolbear, et al. on Dec. 15, 1992, entitled "LIQUID METAL PASTE FOR THERMAL AND ELECTRICAL CONNECTIONS", a thermally and electrically conductive paste is used for cooling electronics. The conductive and compliant paste are connected between the IC chip surface and the heat exchanger surface. It consists of an equilibrium mixture of liquid metal with particulate solid constituents, such as particles or fibers. The materials added to the liquid metal as well as their compositions are selected such that a paste is formed instead of a permanent solid. Various types of liquid metals are suggested, including gallium, indium, mercury, cadmium and bismuth. Also, numerous powder additives are employed such as alumina, aluminum, aluminum nitride, chromium, gold, lead, and silicon, to name a few. The application of the paste is for thermal conduction purposes. As such, the paste does not undergo a change of state, i.e., melt and re-solidify under the IC chip operational conditions. The mixture does not provide the melting and solidifying properties in the IC chip operational temperature range for which the material must have the properties of releasing or absorbing sufficient heat to counteract the effects of mini-cycles.

In U.S. Pat. No. 5,325,265 issued to Turlik, et al. on Jun. 28, 1994, entitled "HIGH PERFORMANCE INTEGRATED CIRCUIT CHIP PACKAGE", cushions formed of thermally conductive low melting point material are placed between the heat sink and the IC chip for the transfer of heat from the chip to the heat exchanger. The cushion is sufficiently thick to be able to absorb movement (dimensional variations) between the IC chip and the heat exchanger during thermal cycling, yet sufficiently thin to act as a thermal conductor between the chip and the heat exchanger. In forming this package, the stress absorbing cushions are designed to have the lowest melting point or deformation temperature of all components used. Once brought together, the entire assembly is heated above the melting temperature of the cushion. The cushions melt and reflow to form conformal cushions between the heat exchanger and the IC chip accommodating the separation irregularities. The preferred material for the cushion is indium or an alloy of indium. Once again, this application is for thermal conduction purposes. The solder is not designed to melt and re-solidify under the IC chip operational temperature range which would absorb and reject heat. Thus, this art does not have the capacity for heat generation and subtraction during the rise and fall of temperature due to mini-cycles. As such, the mini-cycle thermal excursions are neither suppressed or attenuated.

Lastly, in U.S. Pat. No. 4,607,277 issued to Hassan et al. on Aug. 19, 1986, entitled "SEMICONDUCTOR ASSEMBLY EMPLOYING NONEUTECTIC ALLOY FOR HEAT DISSIPATION", an alloy was employed to form a low thermal resistance bridging interface between the surface of an IC chip and the surface of a heat exchanger. The alloy has a solidus-liquidus temperature range such that the solidus is slightly below the maximum operating temperature of the chip, and thus has the capability to reestablish and maintain the interface at a low thermal resistance if stressed during circuit operation. The alloy, however, which is preferably a composition of bismuth, lead, tin and indium, initially only makes contact with the surface of the chip at spaced points between voids. During IC package assembly, the temperature of the device is raised to the melting range of the alloy. The bismuth alloy then melts and conforms under viscous flow conditions to fill the void spaces between the chip and the heat exchanger. Disruptions due to dimensional variations, differential thermal expansions, and impact load effects will increase the thermal resistance due to the reoccurrence of voids. Thus, the temperature will rise into the melting range of the alloy, thereby recovering the low thermal resistance. In effect, a self-healing process of the alloy melting to conform to the chip surface occurs so that the contact thermal resistance is maintained at a low level. Similar to the above referenced inventions, this prior art also has the objective of dissipating heat more efficiently by minimizing interfacial thermal resistance. Here, it is done with the use of molten solder. The solder, however, remains a distance away from the chip and would not be able to significantly attenuate the temperature cycling due to mini-cycles even if the solder were suitable and had the requisite thermodynamic properties to meet the requirements of power dissipation in the proper temperature range. Thus, the patent is strictly one for improving heat conduction through the improvement of the thermal resistance path.

Bearing in mind the problems and deficiencies of the prior art, it is therefore an object of the present invention to provide a method and apparatus for the removal of heat from an integrated circuit chip to ambient air that attenuates the effects of thermal mini-cycles associated with IC chip operation.

It is another object of the present invention to provide a method and means for removing heat from an integrated circuit chip without incurring thermally induced shear stress on the chip or the accompanying substrate.

A further object of the invention is to provide a low thermal resistance path between the IC chip and its associated heat exchanger.

It is yet another object of the present invention to provide an IC chip package in which thermal mismatches between the chip, its associated heat exchanger, and an interfacing thermal conducting material are minimized.

Yet another object of the present invention is to provide a more efficient way to dissipate heat from an integrated circuit chip through its associated heat exchanger and the joint bond there between.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method of making a thermally conductive interface for an electronic module comprising: providing an integrated circuit chip with a top and bottom surface, and an operational temperature range between a highest temperature and a lowest temperature, wherein the integrated circuit chip generates thermal cycles within the operational temperature range; and applying a bonding composition to the integrated circuit chip such that the bonding composition has a solidus-liquidus temperature range that encompasses the integrated circuit chip operational temperature range, wherein the solidus temperature is less than or equal to the integrated circuit chip operational temperature range lowest temperature and the liquidus temperature is greater than or equal to the integrated circuit chip operational temperature highest temperature, and heat generated by each of the thermal cycles is partially or totally absorbed by the melting of a portion of the bonding composition that is in a solid phase, and heat lost by each of the thermal cycles is compensated by heat released from the solidifying of a portion of the bonding composition that is in a liquid phase. Additionally, the method further comprises providing a cap-heat exchanger cover with a bottom surface, including a cap cover portion and a heat exchanger cover portion formed in a single cover piece, wherein the bottom surface of the heat exchanger cover portion is attached to the integrated circuit chip top surface. However, the method may also comprise a cap-heat exchanger cover with a bottom surface, where the cap cover portion is attached to the heat exchanger cover portion.

The method further comprises providing a substrate with a top surface such that the bottom surface of the integrated circuit chip is connected to the substrate top surface, and the bottom surface of the cap cover portion is attached to the substrate top surface. The substrate has seal bands on the top surface to contain the bonding composition and provide an hermetic seal for the electronic module.

The bonding composition comprises: a preform Bi—In composition of 25% Bi by weight, with a liquidus temperature of about 100° C.; a preform Bi—In eutectic of 34% Bi by weight, with a liquidus temperature of about 72° C.; or, preform solder materials that melt at or below room temperature including:

a) Ga—In composition of 70% In by weight, with a eutectic temperature of about 16.5° C. and a liquidus of about 90° C.;

b) Ga—Zn composition of 85% Ga by weight, with a eutectic temperature of about 29.8° C. and a liquidus of about 110° C.; or, c) Ga—Sn composition of 40% Sn by weight, with a eutectic temperature of about 20° C. and a liquidus of about 110° C.

The method further includes a thin solder wetable film structure over the top surface of the integrated circuit chip, the bottom surface of the heat exchanger cover portion, the bottom surface of the cap cover portion, and the top surface of the substrate, to achieve bonding during the bonding composition reflow. The thin film structure is preferably comprised of Cr—Ni—Au films deposited or evaporated on each of the surfaces.

The bonding composition can be affixed within a cavity within the heat exchanger bottom surface. The cap-heat exchanger cover is comprised of a ceramic material 1 mm to 2.5 mm thick, such that the cover is compliant, conforming to vertical displacements caused by different thermal expansions of materials. The cap cover portion may also be connected to the substrate top surface, and to the seal bands on the substrate top surface, through a Pb—Sn alloy preform compatible with the thermal hierarchy associated with the method.

The present invention is directed to, in a second aspect, a method of making a thermally conductive interface for an electronic module comprising:

providing a substrate with a top surface, having seal bands on the top surface;

providing an integrated circuit chip with a top and bottom surface, and operational within a temperature range between a highest temperature and a lowest temperature, the bottom surface connected to the substrate top surface, wherein the integrated circuit chip generates thermal cycles within the operational temperature range;

providing a cap-heat exchanger cover with a bottom surface, comprising a cap cover portion and a heat exchanger cover portion formed in a single cover piece, wherein the bottom surface of the cap cover portion is attached to the substrate top surface, and the bottom surface of the heat exchanger cover portion is attached to the integrated circuit chip top surface;

connecting the top surface of the integrated circuit chip to the bottom surface of the heat exchanger cover with a solder composition, wherein the solder composition has a solidus-liquidus temperature range that encompasses the integrated circuit chip operational temperature range, wherein the solidus temperature is less than or equal to the integrated circuit chip operational temperature range lowest temperature and the liquidus temperature is greater than or equal to the integrated circuit chip operational temperature highest temperature, and heat generated by each of the thermal cycles is partially or totally absorbed by the melting of a portion of the solder composition that is in a solid phase, and heat lost by each of the thermal cycles is compensated by heat released from the solidifying of a portion of the solder composition that is in a liquid phase; and connecting the bottom surface of the cap cover to the top surface of the substrate.

The method further comprises a diffusion barrier, lined on the cover bottom surface, to limit ingress of oxygen, solder oxidation, and solder outflow in non-hermetically sealed and semi-hermetically sealed electronic modules. A thin film structure comprised of Cr—Ni—Au films is deposited or evaporated on each of the solder contacting surfaces. Also, the connections are performed by applying heat to the electronic module above solder melting temperatures.

In a third aspect, the present invention is directed to a method for connecting two surfaces of an electronic module comprising:

providing a substrate with a top surface, having seal bands on the top surface;

providing an integrated circuit chip with a top and bottom surface, and an operational temperature range between a highest temperature and a lowest temperature, the integrated circuit chip bottom surface attached to the substrate top surface;

providing a cover over the integrated circuit chip and the substrate, comprising a cap portion with a bottom surface and a heat exchanger portion with a bottom surface; and attaching the cover to the substrate and the integrated circuit chip, the attachment comprising:
i) depositing or evaporating an alloy with a defined melting point on the substrate top surface, the cap cover portion bottom surface, the heat exchanger portion bottom surface, and the substrate seal bands;
ii) heating the alloy above the melting point;
iii) applying a solder composition preform between the integrated circuit chip top surface and the heat exchanger cover portion bottom surface, wherein the solder composition has a solidus-liquidus temperature range encompassing the integrated circuit chip operational temperature range;
iv) applying a Pb—Sn solder preform between the cap cover portion bottom surface and the substrate top surface; and
iv) heating the electronic module above the melting point of the solder preforms.

This method further comprises providing an elastomeric ring between the cover and the substrate top surface to non-hermetically sealed and semi-hermetically sealed electronic modules, such that the ring eliminates solder outflow and prohibits environmental degradation to soldered surfaces.

In a fourth aspect, the present invention is directed to an apparatus for maximizing thermal conduction and eliminating the adverse effects of operational thermal cycling comprising:

an integrated circuit chip having a top surface and a bottom surface, and operational within a temperature range between a highest temperature and a lowest temperature; and a bonding composition on a surface of the integrated circuit chip, the bonding composition having a solidus-liquidus temperature range encompassing the integrated circuit chip operational temperature range, such that the bonding composition is in a semi-molten state when power is applied to the integrated circuit chip and the chip is operating within the chip operational temperature range.

The apparatus further comprises a substrate with a top surface, having seal bands on the top surface, wherein the integrated circuit chip bottom surface is attached to the substrate top surface.

Additionally, the apparatus comprises, a cover attached to the substrate top surface and the integrated circuit chip top surface, comprised of a ceramic cap cover portion and a heat exchanger cover portion, wherein the cover is mounted as a single piece over the integrated circuit chip and the substrate, the heat exchanger cover portion having a bottom surface over the integrated circuit chip top surface.

The apparatus further comprises a solder wetable thin film structure over the top surface of the integrated circuit chip, the bottom surface of the heat exchanger cover portion, the bottom surface of the cap cover portion, and over the top surface of the substrate.

The apparatus may also be comprised of a cap cover that is ceramic. The bonding composition is preferably on the order of 13 to 17 mils in thickness.

Additionally, the apparatus further comprises a diffusion barrier, for use with non-hermetically sealed or semi-hermetically sealed electronic modules, of a polymeric ring fitted within a groove in the cover.

The apparatus includes a thin film structure that is comprised of a deposition or evaporation of Cr—Ni—Au layers. This thin film structure includes a Cr layer 100 nm thick, a Ni layer 1000 nm thick, and a Au layer 50 nm thick.

The apparatus may also include a bonding composition used at the eutectic composition wherein the composition will melt completely at the eutectic temperature of the alloy.

The present invention, in a fifth aspect, is directed to a method of using an electronic module for maximizing thermal conduction and eliminating the adverse effects of operational thermal cycling comprising:

providing an integrated circuit chip having a top surface and a bottom surface, and operational within a temperature range, and a bonding composition on of the surfaces, the bonding composition having a solidus-liquidus temperature range encompassing the integrated circuit chip operational temperature range;

applying power to the integrated circuit chip; and, cycling temperature within the integrated circuit chip a maximum and minimum temperature within the operational temperature range such that the bonding composition remains in a semi-molten state when power is applied to the integrated circuit chip, such that heat energy is absorbed by a change of state of the bonding composition from a solid state to a liquid state, and heat energy is delivered by a change of state of the bonding composition from a liquid state to a solid state.

The method further comprises removing heat energy from the integrated circuit chip through a heat exchanger attached to the chip by the bonding composition.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
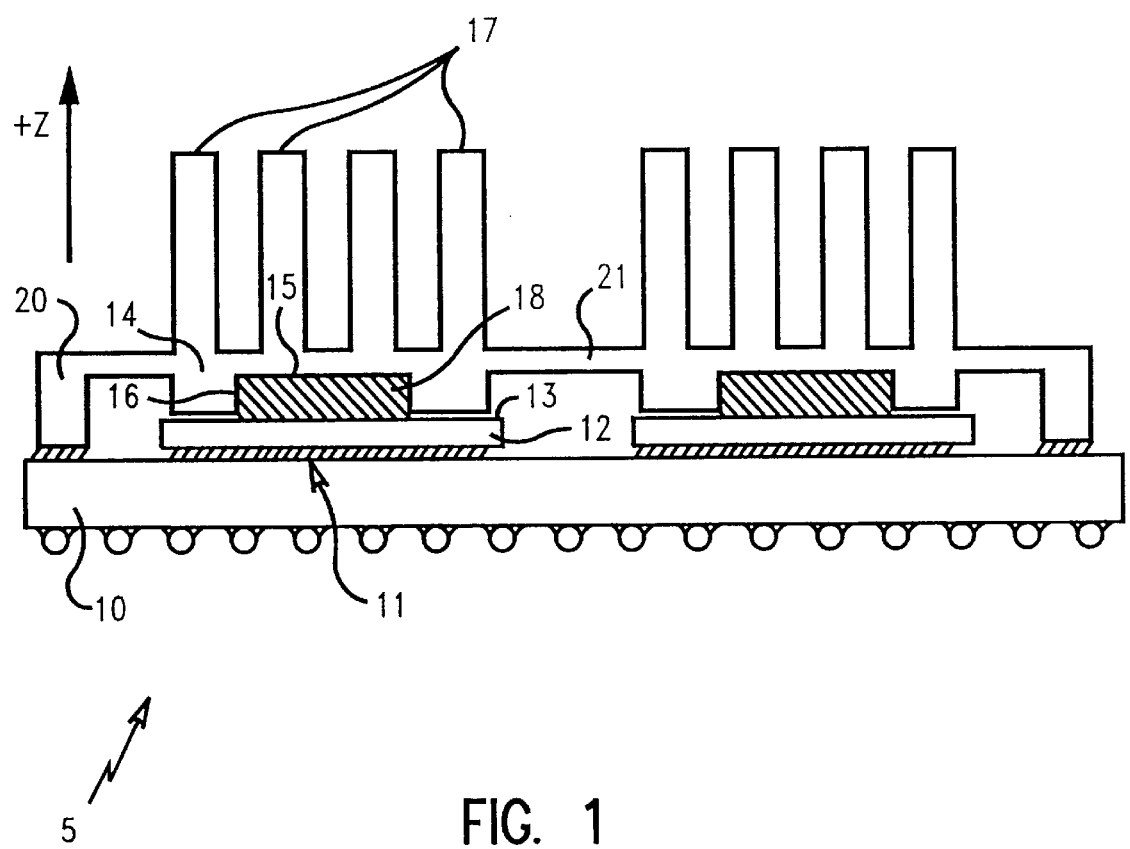
FIG. 1 is an elevational view in cross section of a multi-chip electronic module package with a cap and heat exchanger cover over the substrate.

In describing the preferred embodiment of the present invention, reference will be made herein to FIGS. 1–5 of the drawings in which like numerals refer to like features of the invention. Features of the invention are not necessarily shown to scale in the drawings.

In order to mitigate the adverse effects of thermal mini-cycles on the heat transfer properties of integrated circuit chips and their associated heat exchangers, a solder is introduced to interface between an IC chip and its associated heat exchanger. The solder composition has a solidus-liquidus temperature range that encompasses the IC chip operational temperature range. Thus, the solidus temperature is less than or equal to the IC chip's lowest operating temperature, and the liquidus temperature is greater than or equal to the IC chip's highest operating temperature. Consequently, the solder is always in the semi-molten state while power is applied to the IC chip, including when the IC chip is in a dormant state, such as, when the electronic system is at a reduced energy conservation level.

The selected solder compositions, with a solidus-liquidus temperature range encompassing the operational temperature range of the IC chip, have the desired property of absorbing and rejecting heat energy by changing state or phase with each temperature rise and decline. The temperature fluctuations are typically associated with the thermal mini-cycles of CMOS technology ICs and power cycle variations resulting from computer power conservation protocols. The heat generated by each mini-cycle is partially or totally absorbed by the melting of some of the solder composition that is in the solid phase, which is an endothermal phase change reaction greatly attenuating or completely eliminating the mini-cycle heat energy transfer. Thus, as the temperature is increased during a mini-cycle, some of the solder composition in the solid phase melts, subtracting heat from the solder mass and curtailing the temperature rise. The reverse occurs when the temperature drops; heat is released from the solder as some of the solder composition in the liquid phase solidifies, again, offsetting the temperature fluctuations caused by the thermal spurious events. From this aspect, the proposed solder compositions will level the temperature fluctuations caused by mini-cycles, reduce the transient power dissipation requirement, and extend the fatigue life of the solder joints.

Diverse solder compositions that comply with the thermal conductivity and phase change requirements will also satisfy the dual function of the current invention. Such high conductivity and phase change materials, which are confined to the location between the IC chip and the heat exchanger, act as thermal conductors as well as reversible energy reservoirs, capable of absorbing or rejecting heat when necessary. The amount of material required in a particular application is predetermined by design, and is calculated to maximize the cooling effectiveness in terms of heat dissipation rate and mini-cycle reduction.

The high-lead and eutectic Pb—Sn solders (and other Sn- and In-bearing solders) have a thermal conductivity that is an order of magnitude higher than the best thermal paste currently developed, which has been the medium employed in multi-chip modules (MCMs) and single chip modules (SCM).

There are instances in the prior art where heat exchangers or heat sinks are directly attached to a single IC chip and not connected to the substrate because of stress and fatigue problems. However, this prior art approach is not conducive for MCMs or SCMs since they must be encapsulated to avoid corrosion and excessive fatigue demand due to a high concentration of oxygen.

In the present invention, the module cap and substrate are made of the same material or materials with compatible thermal coefficients of expansion (TCE), e.g., aluminum nitride/aluminum nitride, or aluminum nitride/glass ceramic. This avoids excessive shear stress and strain in the C-4 joint and also unacceptable fatigue performance upon solder solidification for low-end modules in which the solder between the chip and cap has reacted with the thin films. For high end MCMs, the lateral relative displacements are free to slide relative to each other. Thus, for hermetic MCMs, the cap and substrate may be of dissimilar materials in terms of TCE.

Analysis of Mini-Cycle Heat Attenuation

The melting of an off-eutectic solder (ipoeutectic, supereutectic) takes place over a range of temperatures, e.g., a 40° C. range from 35° C. to 75° C., which is fixed by the composition chosen. If the heat of fusion is on the order of 46 joules/gram, distributed over 40° C., then 1.15 joules/gram-° C. may be supplied or removed during mini-cycle temperature perturbations. For a typical 15 mm IC chip with a 20 mil thick solder, which has a total mass of 1.4 grams, the heat absorbed or rejected is calculated in the following manner:

1.4 grams×1.15 joules/gram-° C.=1.6 joules/° C. per chip.

On the other side of the energy conservation equation, is the utilization of this heat by the IC chip and solder during solidification, or removal of the heat during fusion. Either activity assists to maintain constant temperature, and is dictated by the heat capacity of the solder and the IC chip. For example, a typical combined specific heat capacity is 1 joule/gram-° C., or at a total mass of 1.4 grams, 1.4 joule/° C. per chip.

Thus, for the illustrative example above, there are 1.6 joules available per degree per chip, and 1.4 joules per degree per chip needed to maintain a constant temperature for the given heat capacity of the chip and solder, which represents the immediate mass that will respond to a change in temperature in large measure. This process is independent of the level of power dissipation under steady-state conditions. It is merely a local amount of heat energy that is absorbed or rejected by the chip and solder under basically isothermal conditions since the temperature does not have an opportunity to rise or fall under the exchange of heat. For each degree that the temperature tends to rise under a mini-cycle, requiring an amount of heat input equal to the heat capacity (1.4 joules/° C.), there is an equivalent amount of heat rejected, 1.6 joules/° C., that sustains the melting of additional solid solder, and is sufficient to keep the temperature stable. The only necessary requirement in this process is that the heat released as a function of the continuous melting and solidifying of the low thermal resistant solder composition, within the IC chip operational temperature range, be fast enough such that diffusion outside the local system (IC chip and solder) does not become appreciable. These conditions are actually met to a high degree based on known diffusion kinetics. The heat annihilation process is independent of the rate of heat dissipation, which is a function of the internal and external thermal resistance. Under this phase or state change process, the IC chip remains in a steady-state condition, unaffected by the heat of fusion which counteracts the heat supplied by the mini-cycle.

Preferred Embodiment

FIG. 1 depicts a multi-chip electronic module package 5. Integrated circuit chip 12 with top surface 13 is shown connected to substrate 10 through C-4 attachments 11. Heat exchanger 14 is located above the IC chip and has a cavity 16 with bottom surface 15 for placement of the thermal conducting material. The heat exchanger 14 is structured to have considerable mass and surface area in order to efficiently transfer the heat energy from the IC chip to the air. Depicted in FIG. 1 is heat exchanger 14 with solid fingers 17 arranged for optimum heat dissipation to the ambient air.

Ceramic cap 20 and heat exchanger 14 are either attached such that they form a single cover over the electronic module's IC chip and substrate, or initially formed as a single structure. Cap 20 is bonded to the top surface of substrate 10. A bonding or solder composition 18 is affixed within cavity 16 of heat exchanger 14. The heat exchanger element over each individual IC chip is connected by the cap material 21, which is relatively thin, preferably varying from about 1 mm to 2.5 mm in thickness depending, in part, upon the size of the substrate. The cap-heat exchanger unit is constructed to be compliant, and to contact both the IC chip and substrate in order to provide a path of high thermal conduction (low thermal resistance) from the IC chip to the heat exchanger to the ambient air.

A compliant cap and heat exchanger unit establishes a key feature of the present invention. It allows the electronic module to provide a unique way to avoid the damaging stress factors that would lead to mechanical failure and fatigue damage of the C-4 upon solder solidification when power is removed from the electronic module. As such, the thickness of the cap between the IC chip sites must be relatively thin to allow bending and to accommodate the vertical displacement caused by the different thermal expansions of materials in the +z direction. The cap and heat exchanger may be bonded together to form one cover piece or fabricated as one piece. Preferably, the cap and heat exchanger are fabricated as one piece. Virtually no stress or IC chip damage is expected when the cap and substrate are made of the same material, e.g., Aluminum-nitride (AlN). For a distance between the IC chip and cap of 15 mils, a C-4 height of 3 mils, and a chip thickness of 30 mils, the vertical displacement is approximately 0.00044 mils/° C. This displacement is equivalent to that of an AlN cap joined to the substrate with a 15 mil thick solder, using thermal coefficients of expansion of 4.6 ppm/° C. for the AlN material, 2.6 ppm/° C. for Si, and 20 ppm/° C. for the solder. Thus, the vertical or +z direction can be made stress free by selecting the proper materials among the ones in common use in industry. For a thin cap, having a thickness of 1–2 mm, there is an appreciable amount of flexibility, i.e., compliance. The solder 18 is at least semi-molten, and expands or contracts against the flexible cap, which in turn induces stresses in the solder well within the elastic limit, such that the strain has no fatigue effect on the C-4 under field application conditions.

As for the shear stress and strain (which depend linearly on the solder joint distance from the center of the chip, and from the center of the substrate assuming the C-4s and the chips are arrayed symmetrically) caused by the thermal expansion of the cap and the chip relative to the substrate, the requirement is that the TCEs of the cap and substrate in the multi-chip module be comparable in order to achieve a minimum shear strain in the interconnection. However, in the present invention, materials having different TCEs such as an AlN cap (4.6 ppm/° C.) and alumina substrate (6.2 ppm/° C.) can be used not only with multi-chip modules but also with single-chip modules since the solder seal constraint can provide ample relief for the shear strains. For plastic substrates, the cap can be made of aluminum, which has a TCE of 25 ppm/° C., comparable to that of plastic. In conjunction with the plastic substrates, AlN, alumina, and glass ceramic materials may be used since the plastic substrate will be easily constrained by these materials given that they have an elastic moduli of about fifty times larger than the plastic. The plastic will be in tension in the x-y plane as it cools from the sealing temperature. Thus, any subsequent thermal cycle in the field is an exercise between tension and less tension, following the substrate dimensions and contributing little to fatigue, as there is no relative displacement between the cap and the substrate, i.e., no buckling or warping, which constitutes an advantage since warping generates tensile strain in the z direction of the C-4. Consequently, in the present invention, there is no real limitation due to stresses in the choice of a cap to match a substrate.

Figure 2A:
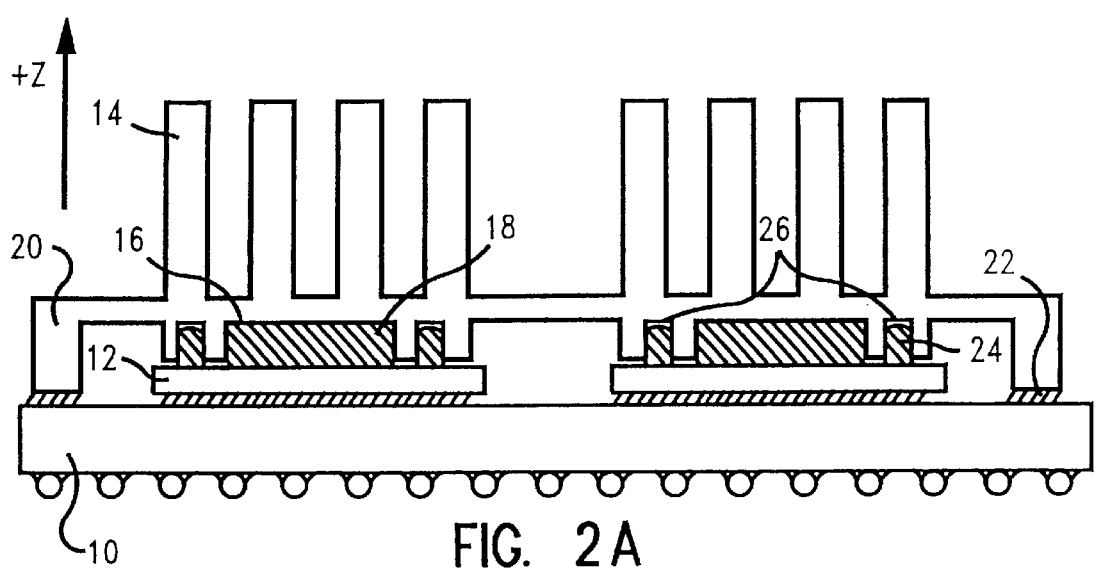
FIG. 2A is an elevational view in cross section of the multi-chip electronic module package with polymeric rings isolating the solder preforms within the heat exchanger cavity.
Figure 2B:
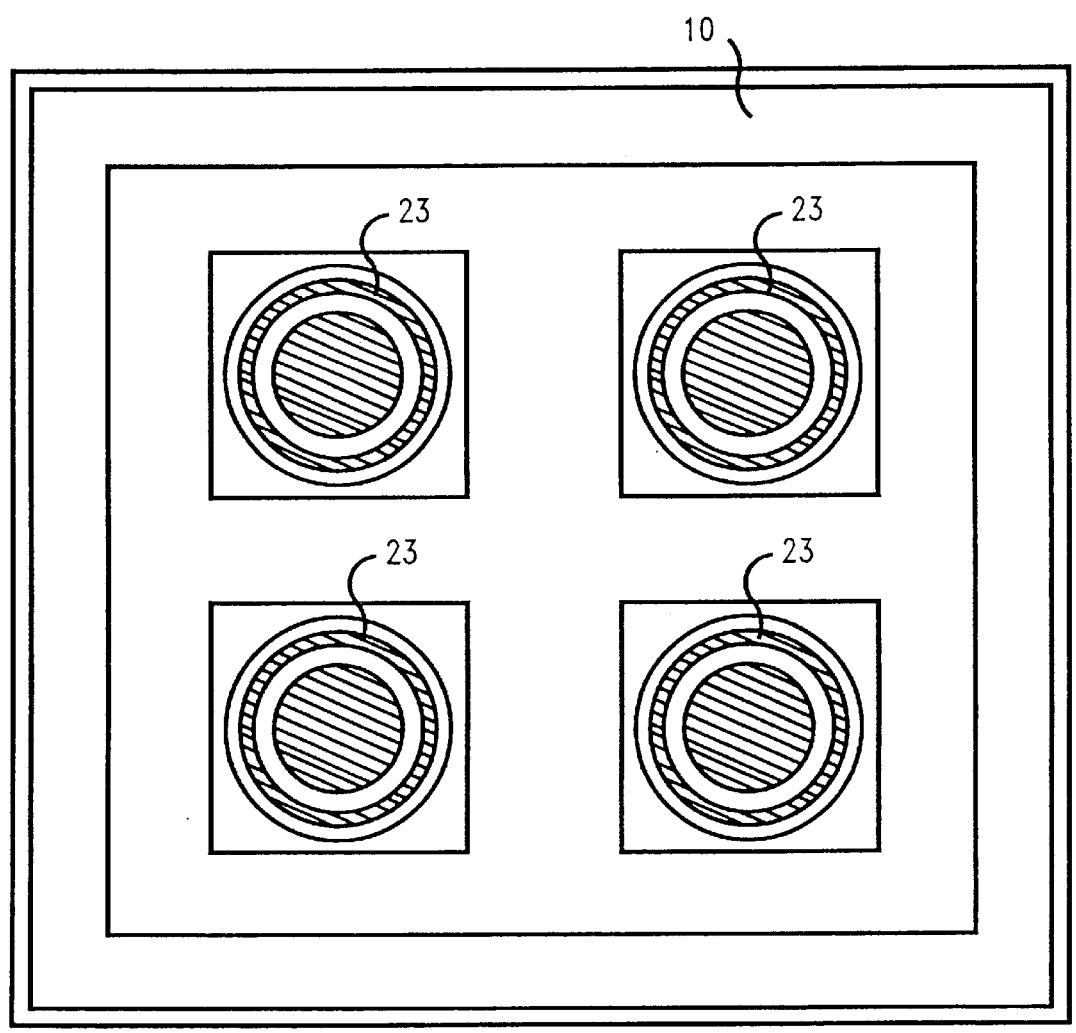
FIG. 2B is a top view of the electronic module substrate with depicting the footprint for the seal bands.

Referring to FIG. 2A, the cap 20 is connected to the substrate 10 through a layer and alloy composition 22, which is preferably a Pb—Sn alloy that is compatible with the process thermal hierarchy. FIG. 2B depicts the substrate seal bands 23 for four electronic module footprints. If the electronic module is non-hermetic or semi-hermetic, a circular elastomeric gasket or polymeric ring 24 is affixed within a groove 26 located in the heat exchanger bottom surface, as shown in FIG. 2A. The polymer can be used to seal the module without significantly affecting the module thermal performance.

Figure 3:
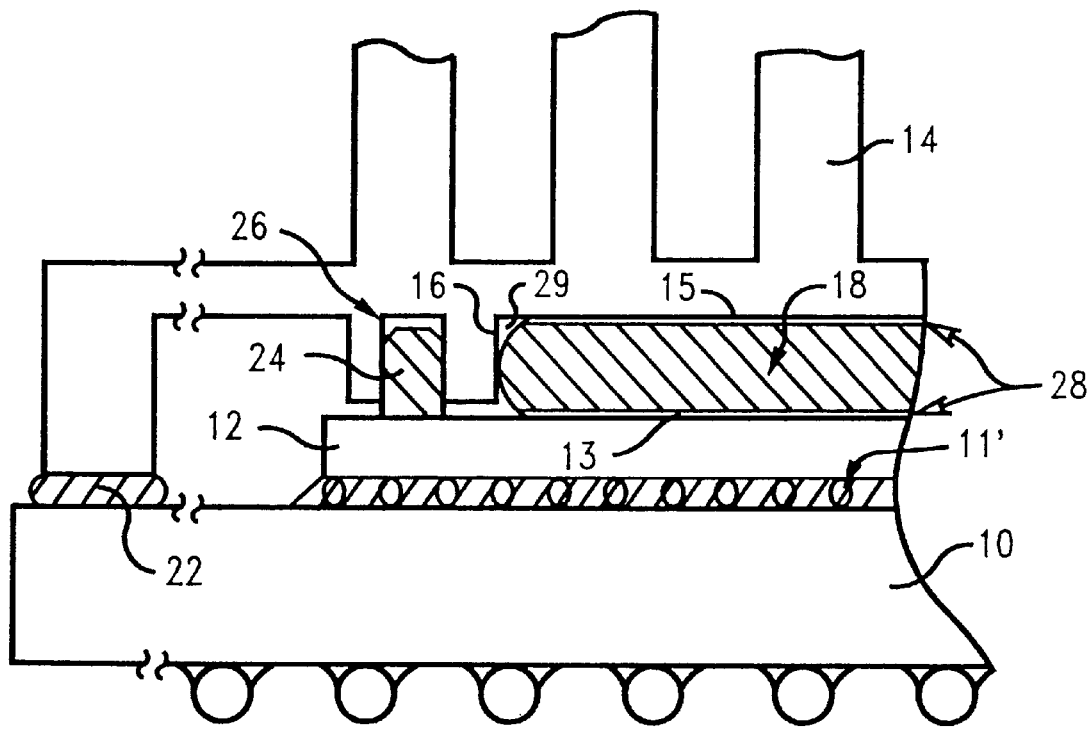
FIG. 3 is an expanded elevational view in cross section of the multi-chip electronic module emphasizing the solder preforms and thin film structures for bonding attachment.

Additionally, for non-hermetic modules, a solder wetable thin film structure 28 may be applied to the bonding points at the IC chip top surface and the heat exchanger bottom surface as shown in FIG. 3, along with the cap-substrate interface. Preferably, this film structure is a composition of Cr—Ni—Au although other thin film structures may be used without compromise. More preferably, the thin film bonding structure is 100 nm Cr, 1000 nm Ni, and 50 nm Au in thickness. Within the heat exchanger cavity 16, the Cr—Ni—Au thin film bonding structure 28 reacts with solder composition 18 during reflow to form a sealed interface. This thin film structure reacts with solder composition 18 in order to create a reaction interfacial region, forming a metallic or intermetallic bond, that prohibits solder oxidation at the contacts. For high end multi-chip modules (MCMs), which are typically hermetically sealed, the thin film bonding structures are not necessitated.

The thin film bonding structure 28, whose thickness may vary by as much as 50% and still be effective, is applied by evaporation or deposition processes to the top surface 13 of the IC chip 12, to the bottom surface 15 of the heat exchanger 14 as indicated in FIG. 3, and also between the cap-substrate interface.

Figure 4:
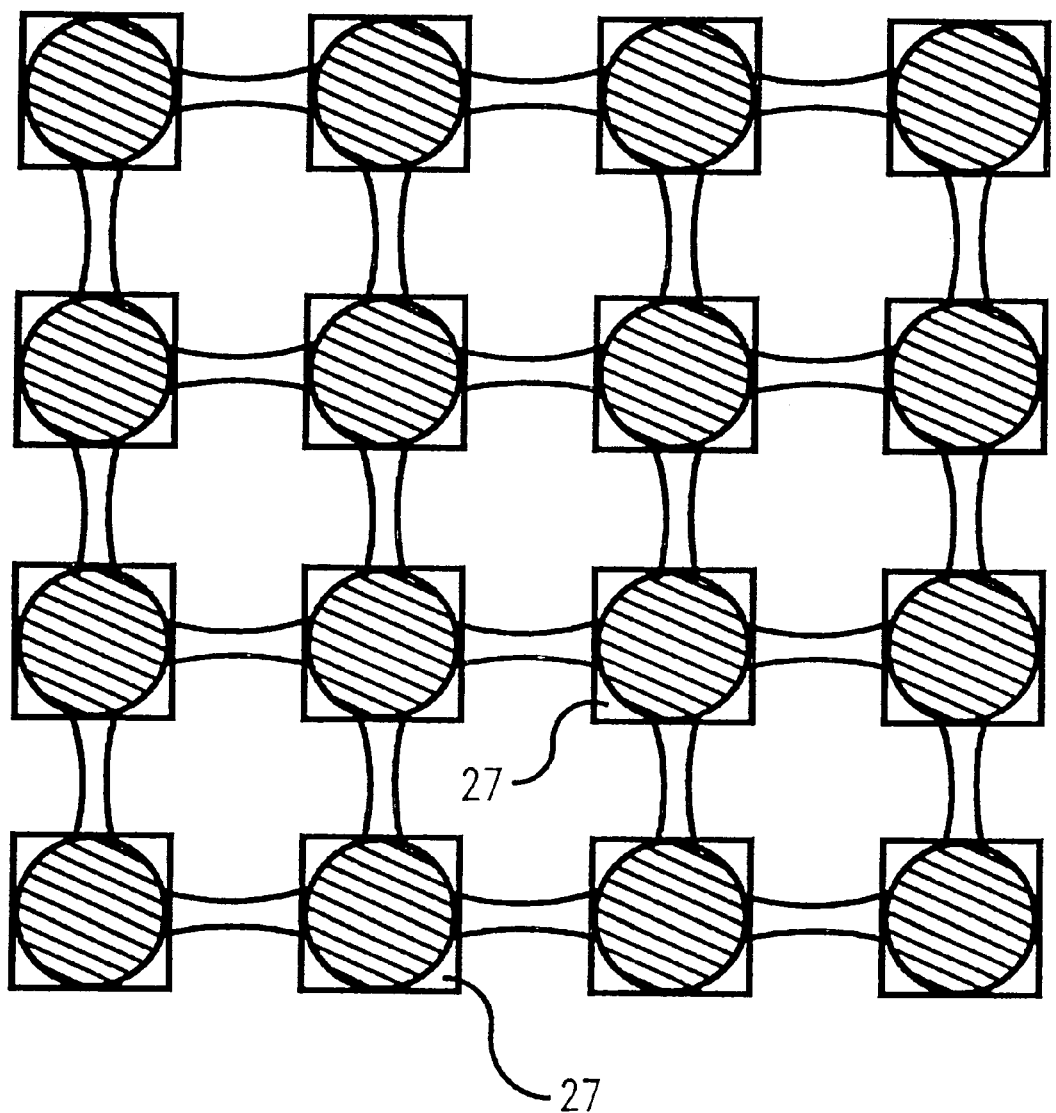
FIG. 4 is a top view of the substrate depicting the cap chip-site positions.
Figure 5:
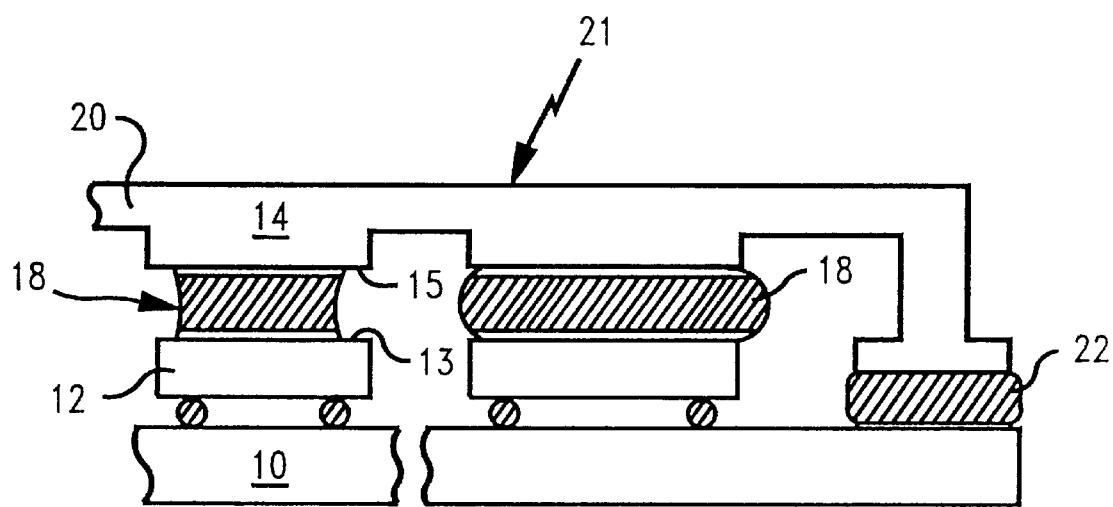
FIG. 5 is an expanded elevational view in cross section of the multi-chip electronic module depicting gap height variability from chip to chip for a given constant solder volume.

Solder preforms 18 and 22 are placed on the IC chip 12 and on the substrate seal band 23, respectively. However, only solder composition 18 is selected such that its solidus-liquidus temperature range encompasses the IC chip operating temperature range. Solder preforms 18 are also placed on the cap chip-site positions 27 as shown in FIG. 4. Heat is applied and these preforms are reflowed independently. The cap-heat exchanger structure is then placed over the IC chip and aligned. Heat is again applied in a furnace to reflow the solder well above its melting point, in order to have adequate reaction rate with the films, and to fill the various gaps completely, with the exception for variations in the solder (cross-sectional area) parallel to each chip due to gap height variability from chip to chip for a given constant solder volume, as illustrated in FIG. 5. In all instances, the typical solder thickness is on the order of 13 mils to 17 mils. This will allow for a small thermal gradient from substrate 10 to cap 20 which may result in minor shear strain at the seal and C4, and is limited by the solder constraint imposed by the seal band. The simultaneous reflow of the solder 18 and 22 in the chip sites and the seal band saves process time and reduces the cost of construction while providing a reduced internal thermal resistance design.

The lateral expansion of the solder 18 and 22 must be allowed to accommodate the different gap heights (in a multi-chip module) between chip and cap, given constant solder volume fixed by the solder preform thickness, as shown in FIG. 5. The gaps may vary by 15% due mainly to substrate camber. For a 15 mm chip, the lateral movement of the molten solder to and from the edge of the chip during capping will be approximately 1 mm. This variation will present no physical restrictions and no thermal shortcomings since the solder conductivity is an order of magnitude greater than current thermal pastes. Thus, the thin films on the chips (in the case of non-hermetically sealed modules or semi-hermetically sealed modules) will be applied up to 1 mm from the edge, allowing the solder to expand up to 1.5 mm due to the convex meniscus (0.5 mm beyond the chip's edge), while the solder is also allowed to retreat over the thin film in the case of larger gaps, forming a concave meniscus 29, depicted in FIG. 3.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a thermally conductive interface for an electronic module comprising:

providing an integrated circuit chip with a top and bottom surface, and operational within a temperature range between a highest temperature and a lowest temperature, wherein said integrated circuit chip generates thermal cycles within said operational temperature range; and applying a bonding composition to said top surface of said integrated circuit chip such that said bonding composition has a solidus-liquidus temperature range that encompasses said integrated circuit chip operational temperature range, wherein the solidus temperature is less than or equal to said integrated circuit chip operational temperature range lowest temperature and the liquidus temperature is greater than or equal to said integrated circuit chip operational temperature highest temperature, and heat generated by each of said thermal cycles is partially or totally absorbed by the melting of a portion of said bonding composition that is in a solid phase, and heat lost by each of said thermal cycles is compensated by beat released from the solidifying of a portion of said bonding composition that is in a liquid phase.

2. The method of claim 1 further comprising providing a cap-heat exchanger cover with a bottom surface, including a cap cover portion and a heat exchanger cover portion formed in a single cover piece, wherein said bottom surface of said heat exchanger cover portion is attached to said integrated circuit chip top surface.

3. The method of claim 2 further comprising providing a substrate with a top surface such that said bottom surface of said integrated circuit chip is connected to said substrate top surface, and said bottom surface of said cap cover portion is attached to said substrate top surface, said substrate having seal bands on said top surface to contain said bonding composition and provide a hermetic seal for said electronic module.

4. The method of claim 3 further comprising a thin solder wetable film structure over said top surface of said integrated circuit chip, said bottom surface of said heat exchanger cover portion, said bottom surface of said cap cover portion, and said top surface of said substrate, to achieve bonding during said bonding composition reflow.

5. The method of claim 4 wherein said thin film structure is comprised of Cr—Ni—Au films deposited or evaporated on each of said surfaces.

6. The method of claim 3 wherein said cap cover portion is connected to said substrate top surface, and to said seal bands on said substrate top surface, through a Pb—Sn alloy preform compatible with the thermal hierarchy associated with said method.

7. The method of claim 2 wherein said bonding composition is affixed within a cavity within said heat exchanger bottom surface.

8. The method of claim 2 wherein said cap-heat exchanger cover is comprised of a ceramic material about 1 mm to 2.5 mm thick, such that said cover is compliant, conforming to vertical displacements caused by different thermal expansions of materials.

9. The method of claim 1 further comprising providing a cap-heat exchanger cover with a bottom surface, including a cap cover portion attached to a heat exchanger cover portion, wherein said bottom surface of said heat exchanger cover portion is attached to said integrated circuit chip top surface.

10. The method of claim 1 wherein said bonding composition comprises a preform Bi—In composition of 25% Bi by weight, with a liquidus temperature of about 100° C.

11. The method of claim 1 wherein said bonding composition comprises preform solder materials that melt at or below room temperature, said preform solder materials selected from the group consisting of: a) Ga—In composition of 70% in by weight, with a eutectic temperature of about 16.5° C. and a liquidus of about 90° C.; b) Ga—Zn composition of 85% Ga by weight, with a eutectic temperature of about 29.8° C. and a liquidus of about 110° C. and c) Ga—Sn composition of 40% Sn by weight, with a eutectic temperature of about 20° C. and a liquidus of about 110° C.

12. A method of making a thermally conductive interface for an electronic module comprising:

providing a substrate with a top surface, having seal bands on said top surface;

providing an integrated circuit chip with a top and bottom surface, and operational within a temperature range between a highest temperature and a lowest temperature, said bottom surface connected to said substrate top surface, wherein said integrated circuit chip generates thermal cycles within said operational temperature range;

providing a cap-heat exchanger cover with a bottom surface, comprising a cap cover portion and a heat exchanger cover portion formed in a single cover piece, wherein said bottom surface of said cap cover portion is attached to said substrate top surface, and said bottom surface of said heat exchanger cover portion is attached to said integrated circuit chip top surface;

connecting said top surface of said integrated circuit chip to said bottom surface of said heat exchanger cover with a solder composition, wherein said solder composition has a solidus-liquidus temperature range that encompasses said integrated circuit chip operational temperature range, wherein the solidus temperature is less than or equal to said integrated circuit chip operational temperature range lowest temperature and the liquidus temperature is greater than or equal to said integrated circuit chip operational temperature highest temperature, and heat generated by each of said thermal cycles is partially or totally absorbed by the melting of a portion of said solder composition that is in a solid phase, and heat lost by each of said thermal cycles is compensated by heat released from the solidifying of a portion of said solder composition that is in a liquid phase; and connecting said bottom surface of said cap cover to said top surface of said substrate.

13. The method of claim 12 wherein said cap-heat exchanger cover comprises attaching a cap cover portion to a heat exchanger cover portion to form a single cover piece.

14. The method of claim 12 wherein said solder composition comprises a preform Bi—In composition of 25% Bi by weight, with a liquidus temperature of about 100° C.

15. The method of claim 12 wherein said solder composition comprises preform solder materials that melt at or below room temperature, said preform solder materials selected from the group consisting of: a) Ga—In composition of 70% in by weight, with a eutectic temperature of about 16.5° C. and a liquidus of about 90° C.; b) Ga—Zn composition of 85% Ga by weight, with a eutectic temperature of about 29.8° C. and a liquidus of about 110° C. and c) Ga—Sn composition of 40% Sn by weight, with a eutectic temperature of about 20° C. and a liquidus of about 110° C.

16. The method of claim 12 further comprising a thin solder wetable film structure over said top surface of said integrated circuit chip, said bottom surface of said heat exchanger cover portion, said bottom surface of said cap cover portion, and said top surface of said substrate, to achieve bonding during solder reflow.

17. The method of claim 16 wherein said thin film structure is comprised of Cr—Ni—Au films deposited or evaporated on each of said surfaces.

18. The method of claim 12 wherein said cover bottom surface is lined with a diffusion barrier to limit ingress of oxygen, solder oxidation, and solder outflow in non-hermetically sealed and semi-hermetically sealed electronic modules.

19. The method of claim 12 wherein said solder composition is affixed within a cavity within said heat exchanger bottom surface.

20. The method of claim 12 wherein said cap cover portion is comprised of a ceramic material about 1 mm to 2.5 mm thick, such that said cover is compliant, conforming to vertical displacements caused by different thermal expansions of materials.

21. The method of claim 12 wherein said cap cover portion is connected to said substrate top surface, and to said seal bands on said substrate top surface, through a Pb—Sn alloy preform compatible with the thermal hierarchy associated with said method.

22. The method of claim 12 wherein said connections are performed by applying heat to said electronic module above solder melting temperatures.

\* \* \* \* \*